United States Patent
Yamasaki et al.

[11] Patent Number: 6,077,728
[45] Date of Patent: Jun. 20, 2000

[54] METHOD OF PRODUCING A CERAMIC PACKAGE MAIN BODY

[75] Inventors: Kozo Yamasaki; Naomiki Kato, both of Nagoya, Japan

[73] Assignee: NGK Spark Plug Co., Ltd., Nagoya, Japan

[21] Appl. No.: 09/071,814

[22] Filed: May 4, 1998

Related U.S. Application Data

[62] Division of application No. 08/775,305, Dec. 31, 1996, Pat. No. 5,822,851, which is a division of application No. 08/347,070, Nov. 23, 1994, Pat. No. 5,621,190.

[30] Foreign Application Priority Data

Dec. 24, 1993 [JP] Japan .................................. 5-347664

[51] Int. Cl.⁷ .......................... H01L 21/44; H01L 21/48; H01L 21/50
[52] U.S. Cl. .......................... 438/125; 438/106; 438/110
[58] Field of Search .................................. 438/125, 110, 438/106

[56] References Cited

U.S. PATENT DOCUMENTS

| | | | |
|---|---|---|---|
| 4,320,438 | 3/1982 | Ibrahim et al. | 361/410 |
| 4,417,392 | 11/1983 | Ibrahim et al. | 29/840 |
| 4,665,468 | 5/1987 | Dohya | 361/414 |
| 4,705,917 | 11/1987 | Gates, Jr. et al. | 174/52 FP |
| 4,866,841 | 9/1989 | Hubbard | 29/845 |
| 4,970,577 | 11/1990 | Ogihara et al. | 357/74 |
| 4,972,253 | 11/1990 | Palino et al. | 357/74 |
| 5,258,648 | 11/1993 | Lin | 257/778 |
| 5,285,352 | 2/1994 | Pastore et al. | 361/707 |
| 5,293,069 | 3/1994 | Kato et al. | 257/698 |
| 5,376,588 | 12/1994 | Pendse | 437/211 |
| 5,400,210 | 3/1995 | Sugimoto et al. | 361/321.5 |
| 5,490,324 | 2/1996 | Newman | 29/830 |
| 5,550,086 | 8/1996 | Tai | 438/126 |
| 5,621,190 | 4/1997 | Yamasaki et al. . | |
| 5,661,090 | 8/1997 | Otani | 438/111 |
| 5,689,091 | 11/1997 | Hamzehdoost et al. | 174/255 |
| 5,736,428 | 4/1998 | Kasaz et al. | 438/123 |
| 5,847,929 | 12/1998 | Bernier et al. . | |

*Primary Examiner*—Kevin M. Picardat
*Assistant Examiner*—D. M. Collins
*Attorney, Agent, or Firm*—Foley & Lardner

[57] ABSTRACT

In a ceramic package main body having a circuit wiring provided to a ceramic substrate and including first and second independent circuit wires, first and second conductive layers are formed on the ceramic substrate. A first connection wire is provided to connect between the first circuit wire and the first conductive layer. A second connection wire is provided to connect between the second circuit wire and the second conductive layer. The first and second conductive layers are electrically insulated from each other for enabling to examine an electrical connection between the first and second conductive layers and determine, from the result of the examination, whether a short circuit is developed between the first and second circuit wires.

10 Claims, 4 Drawing Sheets

METHOD OF PRODUCING A CERAMIC PACKAGE MAIN BODY

This application is a divisional of application Ser. No. 08/775,305, filed Dec. 31, 1996 now U.S. Pat. No. 5,822,851 which in turn is a divisional of application Ser. No. 08/347,070 filed Nov. 23, 1994 now U.S. Pat. No. 5,621,190.

BACKGROUND OF THE INVENTION

1. Field of the Invention

The present invention relates in general to ceramic packages and more particularly to a ceramic IC (integrated circuit) package base or main body constructed of a ceramic substrate and a circuit wiring, resistor wiring, condenser, etc. formed inside and/or outside the ceramic substrate, which makes it easier to carry out a check or inspection for its insulation defect, short circuit defect, etc.

2. Disclosure Information

Generally, a ceramic package main body equipped with an integrated circuit, etc., is produced by printing a circuit wiring pattern made of a tungsten paste or the like onto a ceramic green sheet or filling through holes of a ceramic green sheet with the paste, laminating a plurality of ceramic green sheets with the circuit wiring pattern and the through holes and forming the laminated sheets into a predetermined shape, and then co-firing the laminated sheets.

Recently, in order to meet with a requirement for a high density integrated circuit and a small-sized IC package, the circuit wires formed inside and outside of the package main body increase in number whilst becoming finer and more complicated in shape, so that the distance between the adjacent circuit wires is becoming smaller.

Accordingly, even a small shift of the printed wires or the like error in size or arrangement of same during printing of paste and/or forming of the package main body may cause a short across the adjacent wires.

In order to change the characteristics of the circuit wiring such as a resistance, a particular portion of a particular wire is formed into a fine width wire or formed of a particular resistance paste containing an increased amount of ceramic component.

In such a case, the wire is liable to be cut off so that a disconnection or open defect may possibly be occur or the resistance value may not be within a desired range.

Usually, a circuit wiring is designed elaborately so as not to cause such a defect. However, because of the shape, etc. of the circuit wiring it is obliged to be designed so as to have a portion liable to cause a defect of the above described kind, resulting in occurrence of a defect of the above described kind concentrated at a particular portion of the circuit wiring.

Further, in order to meet with an increase in operation frequency of a recent integrated circuit, there occurs increasingly such a case in which a condenser is built in a package main body in order to prevent malfunction caused by noise.

In order to form such a condenser, various methods have been proposed. One of the methods is to form a condenser inside the package main body and another is to form a condenser on the surface of the package main body by the use of a thick-film and/or thin-film forming technique.

Particularly, in case a ceramic material similar to that forming the ceramic substrate or capable of being co-fired with the same is used for forming a dielectric layer inside a package main body, the dielectric layer is often made thinner with a view to making the electrostatic capacity larger since the dielectric constant of the ceramic material is low. In this instance, an insulation defect or short-circuit defect between electrodes forming a condenser will be often caused or there may possibly occur such a case where a desired electrostatic capacity is not attained.

In the meantime, end portions of the above described circuit wiring are formed with terminals for connection with an integrated circuit or the like, such as bonding pads or bumps. That is, by wire bonding or tape-automated bonding (TAB), the bonding pads are connected to an integrated circuit, or by flip-chip solder bonding, also called controlled-collapse-chip-connection (C4) the bumps are connected to an integrated circuit.

Other end portions of the circuit wiring are generally affixed with pins, leads, solder balls, or the like to serve as external terminals for connection with other circuit components.

Further, electrodes forming a condenser are connected to the circuit wiring.

In order to improve the bondability, the resistance to oxidation, etc., it has been widely practiced to plate the bonding pads, bumps, external terminals, or the like with a precious metal, particularly gold, even when they are plated with nickel as a base metal.

In this instance, although there are some cases where electroless plating is employed for this end, electroplating is used in many cases for the reason of the quality of coating, easy process, easy control of plating solutions, etc.

The electroplating requires to set up a potential at a portion to be plated. There are some methods available to this end, that is, one wherein plating contacts are brought into direct contact with bonding pads, or the like to make them conduct, and one wherein a plurality of external terminals are preformed in such a manner as to constitute a single unit and fixed to the end portions of the circuit wiring so that all of the external terminals are made to conduct and after plating the external terminals are separated one by one.

However, those methods are encountered by a problem in that the external terminals are partially not plated, and the process for separating the terminals one by one is troublesome, etc.

For the above reasons, the following method is employed in many cases.

That is, as shown in FIG. 8, connection wires 26 which are so called plating tie bars are previously printed together with circuit wires 22 onto a ceramic green sheet in such a manner as to extend to the peripheral side surfaces 21A~21D of the green sheet. The ceramic green sheet and another ceramic green sheet or sheets produced similarly as above are laminated and cut into a predetermined shape. Then, a conductive paste is printed onto the peripheral side surfaces 21A~21D so as to form-conductive layers 27A~27D through which the connection wires 26 are electrically connected to each other. Under this condition, the laminated ceramic green sheets are fired to complete a ceramic substrate 21. Further, desired external terminals (not shown) are affixed to the ceramic substrate 21. Thereafter, the conductive layers 27A~27D are brought into contact with plating contacts for plating the pads, bumps, terminals and the like all at once. After that, the conductive layers 27A~27D are removed by grinding or the like for thereby making the circuit wires 22 be independent from each other, whereby the package main body is completed.

In such a case, the above described conductive layers 27A~27D, as shown in FIG. 8, are formed on the peripheral side surfaces 21A~21D in such a manner as to be conductive to each other by way of connection wires 26a~26h. In another method, the conductive layers 27A~27D may be formed so as to be connected to each other by being extended around the corners of the ceramic substrate 21.

By the above manner, if only one of the conductive layers 27A~27D is brought into contact with the plating contacts and electrically connected thereto, it becomes possible to plate all of the pads, terminals, and the like at once, thus being convenient since the plating can be attained with ease and assuredness.

However, in case of such a process being employed, the inspection or check of the package main body for the above described defect of the circuit wires 22 requires to carry out inspections of the circuit wires independently, so that it becomes possible to carry out the inspection only after the plating of the ceramic substrate 21 and removal of the conductive layers 27A~27D.

In such a case, it is obliged to throw away a defective package main body in a state of being added with value such as gold plating, etc., thus increasing the manufacturing cost. This is particularly true when the yield rate in production of the package main body is low due to the difficulty in design of the circuit wiring and/or the necessity of being provided with a condenser or the like, which leads to a further problem on a manufacturing process that it becomes necessary to add good products to the manufacturing line hastily in order to compensate for the defective products.

SUMMARY OF THE INVENTION

According to an aspect of the present invention, there is provided a novel and improved ceramic package main body which comprises a ceramic substrate, a circuit wiring formed inside or outside of the ceramic substrate and including first and second independent circuit wires, first and second conductive layers formed on the ceramic substrate, a first connection wire connecting between the first circuit wire and the first conductive layer, and a second connection wire connecting between the second circuit wire and the second conductive layer, wherein the first and second conductive layers are electrically insulated from each other.

According to another aspect of the present invention, there is provided a ceramic package main body which comprises a ceramic substrate, a circuit wiring formed in or on the ceramic substrate and including a circuit wire having first and second portions spaced apart from each other, first and second conductive layers formed on the ceramic substrate, a first connection wire connecting between the first portion of the circuit wire and the first conductive layer, and a second connection wire connecting between the second portion of the circuit wire and the second conductive layer, wherein the first and second conductive layers are electrically connected to each other through the circuit wire only.

According to a further aspect of the present invention, there is provided a ceramic package main body which comprises a ceramic substrate, a condenser formed in or on the ceramic substrate and constructed of first and second electrode layers and a dielectric layer, first and second conductive layers formed on the ceramic substrate, a first connection wire connecting between the first electrode layer and the first conductive layer, and a second connection wire connecting between the second electrode layer and the second conductive layer, wherein the first and second conductive layers are electrically insulated from each other.

According to a further aspect of the present invention, there is provide a method of producing a ceramic package main body. The method comprises the steps of preparing a ceramic substrate having a circuit wiring, the circuit wire including first and second circuit wires which are to be electrically insulated from each other, forming on the ceramic substrate first and second conductive layers which are electrically insulated from each other, forming on the ceramic substrate a first connection wire connecting between the first circuit wire and the first conductive layer, forming on the ceramic substrate a second connection wire connecting between the second circuit wire and the second conductive layer, and examining an electrical connection between the first and second conductive layers and determining, from a result of the examining, whether a short circuit is developed between the first and second circuit wires. The method further comprises, after the step of the examining and determining, the step of electroplating the circuit wiring by electrically connecting the first and second conductive layers to a power unit. The method still further comprises, after the step of electroplating, the step of removing the first and second conductive layers.

According to a further aspect of the present invention, the method comprises the steps of preparing a ceramic substrate having a circuit wiring, the circuit wiring including a circuit wire having first and second portions spaced apart from each other, forming on the ceramic substrate first and second conductive layers which are electrically insulated from each other, forming on the ceramic substrate a first connection wire connecting between the first portion of the circuit wire and the first conductive layer, forming on the ceramic substrate a second connection wire connecting between the second portion of the circuit wire and the second conductive layer, and examining an electrical connection and/or a resistance value between the first and second conductive layers and determining, from a result of the examining, whether an open defect and/or resistance value defect are caused between the first and second portions of the circuit wire.

According to a further aspect of the present invention, the method comprises the steps of preparing a ceramic substrate having a condenser constructed of first and second electrode layers and a dielectric layer, forming on the ceramic substrate first and second conductive layers which are electrically insulated from each other, forming on the ceramic substrate a first connection wire connecting between the first electrode layer and the first conductive layer, forming on the ceramic substrate a second connection wire connecting between the second electrode layer and the second conductive layer, and examining an electrical connection, insulation resistance and/or an electrostatic capacity between the first and second conductive layers and determining, from a result of the examining, whether an insulation defect, short defect and/or an electrostatic defect are caused between the first and second electrode layers of the condenser.

According to a further aspect of the present invention, the method comprises the steps of preparing a ceramic package main body having a ceramic substrate, two conductive layers formed on a side surface of the ceramic substrate and electrically insulated from each other and a circuit wiring or condenser formed inside of or on a surface of the ceramic substrate, and examining an electrical property between the conductive layers and determining, from the results of the examining, an electrical property of the circuit wiring or the condenser.

The term "electrical property" is herein used to indicate electrical connection, resistance, insulation resistance, electrostatic capacity, inductance, impedance or the like electrical property which is possessed by a circuit wire of itself, a circuit portion between particular wires, condeser or the like and which can be obtained by electrical measurement.

According to a further aspect of the present invention, the method comprises the steps of preparing a ceramic package main body having a ceramic substrate, a circuit wiring formed inside of or on a surface of the ceramic substrate, a plurality of conductive layers formed on the ceramic substrate, and a plurality of connection wires connecting between the circuit wiring and the conductive layers, and examining an electrical property between the conductive layers and determining, from the result of the examining, an electrical property between selected particular wires of the circuit wiring.

According to a further aspect of the present invention, the method comprises the steps of preparing a ceramic package main body having a ceramic substrate, a circuit wiring formed inside of or on a surface of the ceramic substrate, conductive layers formed on the ceramic substrate, a first connection wire connecting between a selected first wire of the circuit wiring and selected first one of the conductive layers, a second connection wire connecting between a selected second wire of the circuit wiring and selected second one of the conductive layers, and examining an electrical property between the first conductive layer and the second conductive layer and determining, from the result of the examining, an electrical property between the first circuit wire and the second circuit wire.

According to a further aspect of the present invention, the method comprises the steps of preparing a ceramic package main body having a ceramic substrate, a circuit wiring formed inside of or on a surface of the ceramic substrate, conductive layers formed on the ceramic substrate, a first connection wire connecting between a first portion of a selected particular wire of the circuit wiring and selected first one of the conductive layers, and a second connection wire connecting between a second portion of the selected particular wire of the circuit wiring and selected second one of the conductive layers, and examining an electrical property between the first conductive layer and the second conductive layer and determining, from the result of the examining, an electrical property between the first portion and the second portion of the selected particular wire.

According to a further aspect of the present invention, the method comprises the steps of preparing a ceramic package main body having a ceramic substrate, a condenser made up of a dielectric layer, a first electrode and a second electrode which are formed inside of or on a surface of the ceramic substrate, first and second conductive layers formed on the ceramic substrate, a first connection wire connecting between the first electrode and the first conductive layer, and a second connection wire connecting between the second electrode and the second conductive layer, and examining an electrical property between the first conductive layer and the second conductive layer and determining, from the result of the examining, an electrical property of the condenser.

The above structure and method of this invention are effective for solving the above noted problems inherent in the prior art devices.

It is accordingly an object of the present invention to provide a novel and improved ceramic package main body which can be checked for a short defect, open defect, resistance value defect, electrostatic capacity defect, or the like prior to being plated or being affixed with external terminals, thus decreasing the manufacturing cost whilst increasing the stability of the manufacturing process.

It is another object of the present invention to provide a method of producing a ceramic package main body of the above described character.

DETAILED DESCRIPTION OF THE PREFERRED EMBODIMENTS

Figure 1:
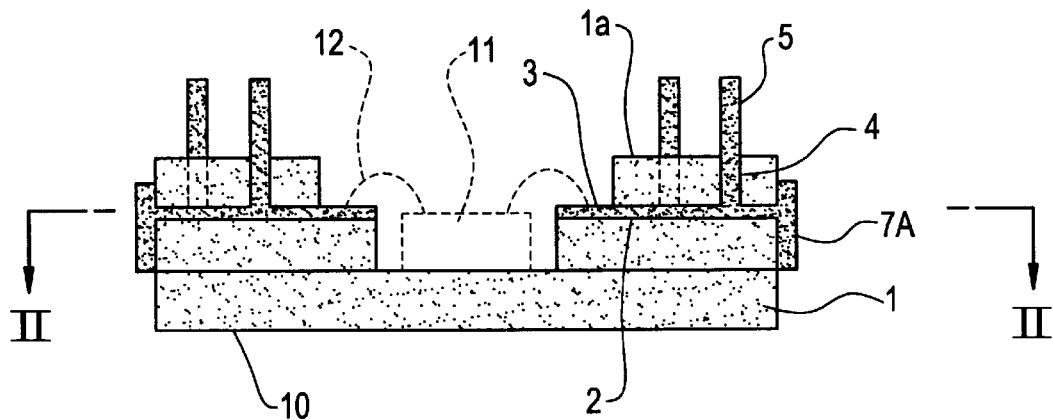
FIG. 1 is a sectional view of a ceramic IC package main body according to an embodiment of the present invention.
Figure 2:
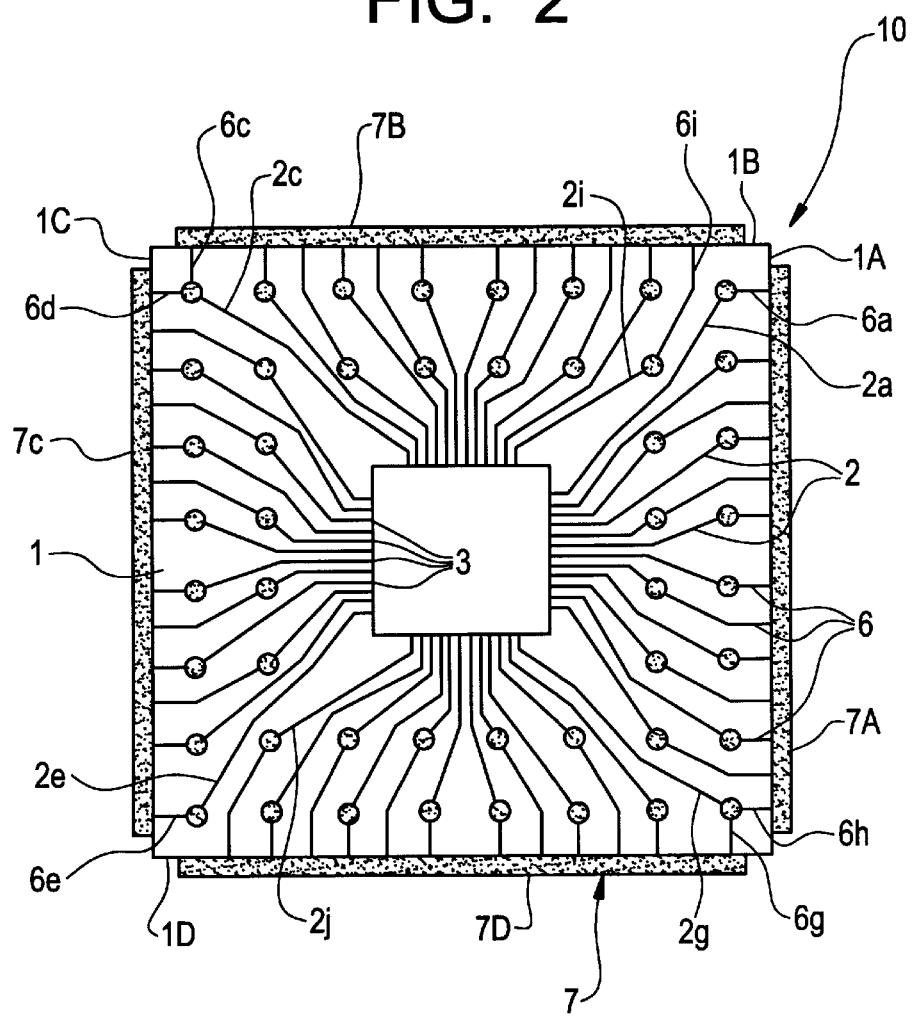
FIG. 2 is a sectional view taken along the line II—II of FIG. 1 and shows in plan a circuit wiring pattern of the package main body of FIG. 1.

Referring first to FIGS. 1 and 2, an IC package main body according to an embodiment of the present invention will be described. FIG. 2 is a diagram of a circuit wiring formed inside of a package main body according to an embodiment of the present invention.

The IC package base or main body is generally designated by 10 and includes a ceramic substrate 1 which is constructed of a laminate of a plurality of ceramic sheets (e.g., three sheets as shown in FIG. 1). One of the ceramic sheets is provided with a circuit wiring 2 having such a pattern as shown in FIG. 2.

Ends of the circuit wiring 2 are used as bonding pads. The pads are a kind of terminal and serve as portions for connection with bonding wires 12 after an integrated circuit chip 11 is installed on the package main body 10, so that the integrated circuit chip 11 is connected through the bonding wires 12 to the circuit wiring 2.

Further, as shown in FIG. 1, the circuit wiring 2 includes via holes 4 plated or filled with a conductive material and penetrating through the sheet so as to be connected at the upper surface 1a of the ceramic substrate 1 to external terminals 5.

Further, as seen from FIG. 2, connection wires 6a, 6c, 6d, 6e, 6g, 6h and 6i are provided so as to connect circuit wires 2a, 2c, 2e, 2g and 2i to conductive layers 7A, 7B, 7C and 7D which are provided to the four peripheral sides of the package main body 10, respectively.

In this instance, the circuit wire 2c is formed so as to be connected through the two connection wires 6c and 6d to the conductive layers 7B and 7C, respectively. Accordingly, the conductive layers 7B and 7C are electrically connected to each other through the connection wires 6c and 6d.

Similarly, the conductive layers 7D and 7A are electrically connected to each other through the connection wires 6g and 6h.

Figure 8:
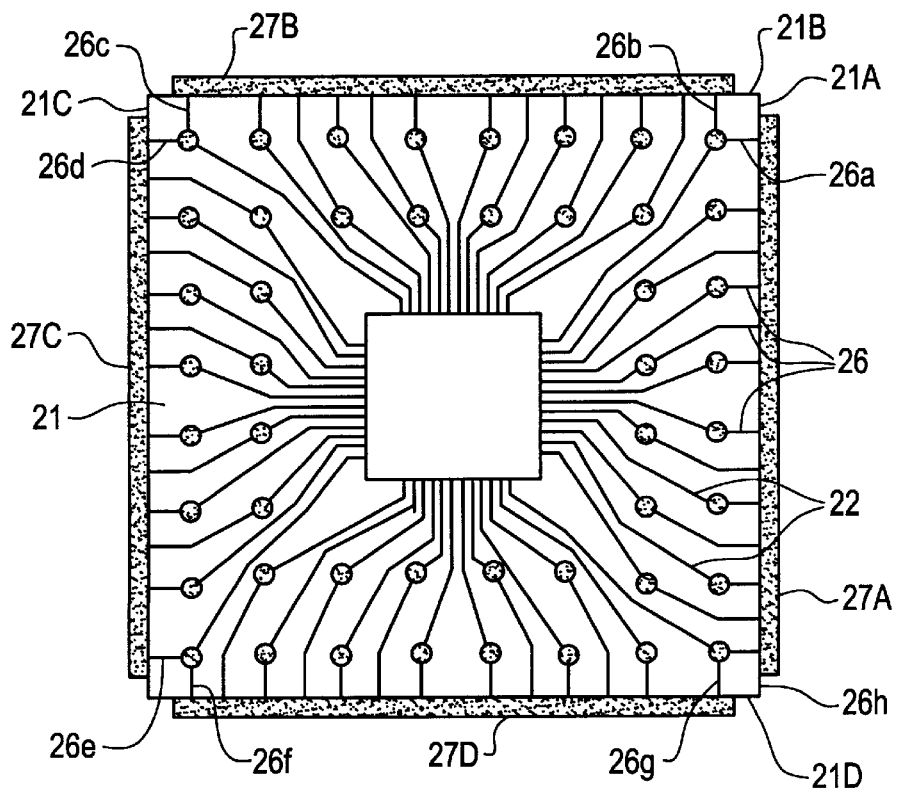
FIG. 8 is a view similar to FIG. 1 but shows a circuit wiring pattern according to a prior art.

On the other hand, the conductive layers 7A and 7B are electrically insulated from each other since any connection wire corresponding to such a connection wire 26b as shown in FIG. 8 is not provided.

That is, since the circuit wire 2a is electrically connected through the connection wire 6a to the conductive layer 7A only and the circuit wire 2*i* is electrically connected through the connection wire 6*i* to the conductive layer 7B only, the circuit wires 2*a* and 2*i* are electrically insulated from each other.

In this instance, if a short circuit is developed between the circuit wires 2*a* and 2*i* due to some defect, for example, a defective circuit wire printing, a defect can be detected easily for removal by inspecting the electrical connection between the conductive layers 7A and 7B.

In case, as described with reference to FIG. 8, all of the conductive layers are electrically connected to each other, such a measurement is impossible naturally.

Further, in either case of forming a thin-film coating by an electroless plating process without forming a plating tie bar (connection wire) or by electrically connecting the external terminals to a current source or unit and thereby performing electroplating, an inspection of a defective insulation between particular circuit wires requires the end portions (pads, bumps or metallized portions for connection with external terminals) or terminals of the circuit wiring which are of a great number and disposed in a quite small area, to be contacted by a probe. This is liable to make the inspection difficult and unassured.

However, since according to the present invention the conductive layer can be larger than the terminal of the circuit wiring and furthermore can be formed on the surface of the package main body (the peripheral side surfaces in this embodiment), the probe for inspection of electrical connection or for measurement of insulation resistance can be easily brought into contact with the conductive layer, thus making it possible to perform the inspection assuredly.

By bringing contacts for plating (not shown) into contact with at least the conductive layers 7A and 7C after the inspection performed in the above manner and performing electroplating whilst allowing the circuit wiring 2 to conduct, electroplating of the bonding pads 3 and external terminals 5 can be attained all at once. In this embodiment, electroplating is performed in such a manner that nickel plating is first performed so as to form an undercoat and then gold plating is performed.

By removing the conductive layers 7A, 7B, 7C and 7D by grinding or the like, the circuit wires can be independent from each other so as to be capable of transmitting desired electrical signals or the like.

Accordingly, since the conductive layer assembly 7 is constructed of two sets of conductive layers which are insulated from each other (i.e., a set of conductive layers 7A and 7D and a set of conductive layers 7B and 7C), a defective product in which a short circuit is developed between particular circuit wires (in this embodiment, between the circuit wires 2*a* and 2*i* or between the circuit wires 2*e* and 2*j*) can be detected for removal by inspecting whether the corresponding conductive layers (e.g., 7A and 7B) are electrically connected or not, thus making it possible to remove defective products prior to adding value to them at the plating process.

The package main body is produced in the following manner.

Ceramic powder containing alumina as a major constituent is mixed with an organic binder and solvent to form a slurry and thereafter formed into a green sheet by means of a doctor blade process. The green sheet is then stamped or punched into a predetermined shape. A high melting point metal paste containing molybdenum and tungsten as major constituents is printed on the punched sheet to form the circuit wiring 2 thereon. In this instance, also formed at predetermined portions of the circuit wiring 2 are connection wires 6 electrically connectable to the conductive layers 7A, 7B, 7C and 7D which are formed in the later process.

Then, after the punched sheets are laminated, adhered to each other by pressure and adjusted in shape to produce a preform, a high melting point metal paste is applied to the peripheral side surfaces of the preform in such a manner as to serve as the conductive layers 7A, 7B, 7C and 7D and electrically connect the same to the above described connection wires 6.

After that, the preform is degreased and fired in a known method, and further brazed with the external terminals 5 or the like, whereby to complete the package main body 10. The method described hereinabove is similar to the prior art.

However, the conductive layers 7A~7D formed on the peripheral side surfaces of the ceramic substrate 1 according to the present invention differs from those of the prior art in that the connection wires 6 or the end portions of the conductive layers 7A~7D are so formed as to separate the connection layers 7A~7D into sets which are insulated from each other.

In the meantime, while, in the above, the inspection of the insulation resistance between the conductive layers 7A~7D has been described as being performed after the package main body is brazed with the external terminals 5, it is more convenient to carry out the inspection before the package main body is brazed with the external terminals since a defective unit can be removed without adding thereto a value resulting from the brazing of the external terminals.

In this instance, while the conductive layers 7A~7D have been described and shown as being formed on the peripheral side surfaces of the ceramic substrate 1, this is not for the purpose of limitation but it will suffice that they are formed on any surfaces of the ceramic substrate in order to carry out the inspection.

However, it is convenient to form the conductive layers on the peripheral side surfaces since the conductive layers become unnecessary after completion of he package main body and removal of the conductive layers can be attained with ease when the conductive layers are formed on the peripheral side surfaces of the ceramic substrate.

Figure 3:
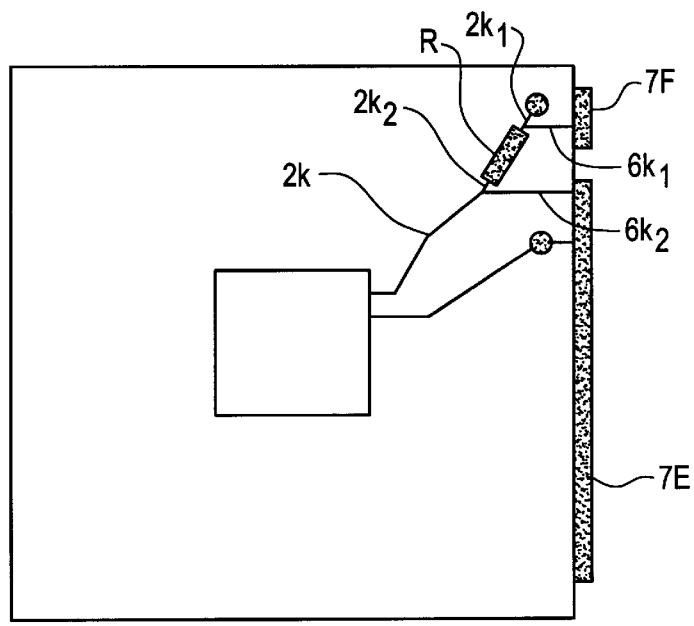
FIG. 3 is a view similar to FIG. 2 but shows another embodiment.

Referring to FIG. 3, another embodiment in which a resistance component is formed in a particular portion of a circuit wiring will be described.

The package main body of this embodiment is produced substantially similarly to the previous embodiment of FIGS. 1 and 2 except that a circuit wire 2*k* has at two places 2*k*1 and 2*k*2 connection wires 6*k*1 and 6*k*2 for connection to independent connection layers 7E and 7F, that the conductive layers 7E and 7F are not electrically connected to each other through any other circuit wire except for the circuit wire 2*k*, and that the circuit wire 2*k* is formed with a resistor R made of resistive paste at location between the two points 2*k*1 and 2*k*2.

In this connection, the resistive paste employed contains tungsten and molybdenum similarly to the paste for forming the circuit wiring but a large quantity of ceramic constituent so as to exhibit a large resistance after firing. Such paste has a good familiarity with the ceramic substrate and is thus suited for being co-fired with the same. However, due to the large ceramic content, the paste is poor in printability and thus liable to cause a large variation of resistance value, disconnection or open defect, etc.

In such a case, by inspecting the continuity or the resistant value between the conductive layers 7E and 7F, a defective unit in which the resistor R has an open defect between the two points 2k1 and 2k2 of the circuit line 2k or a defect of the resistance value, can be detected easily for removal.

However, the inspection requires that continuity between the connection lines 6k1 and 6k2 is normal. In case the resistor R is more liable to cause a defect due to the nature of the paste and the thickness or width of wire, etc., the inspection result can be generally considered as the inspection result on the resistor R.

In the meantime, it will be apparent that this embodiment is applicable to such a case wherein the circuit wire 2k is liable to cause a disconnection defect or a resistant value defect due to the shape, etc. of a portion between particular points 2k1 and 2k2 though it is not provided with the resistor R.

Accordingly, in such a case a defective unit can be detected for removal before a value of plating or the like is added thereto.

Figure 4:
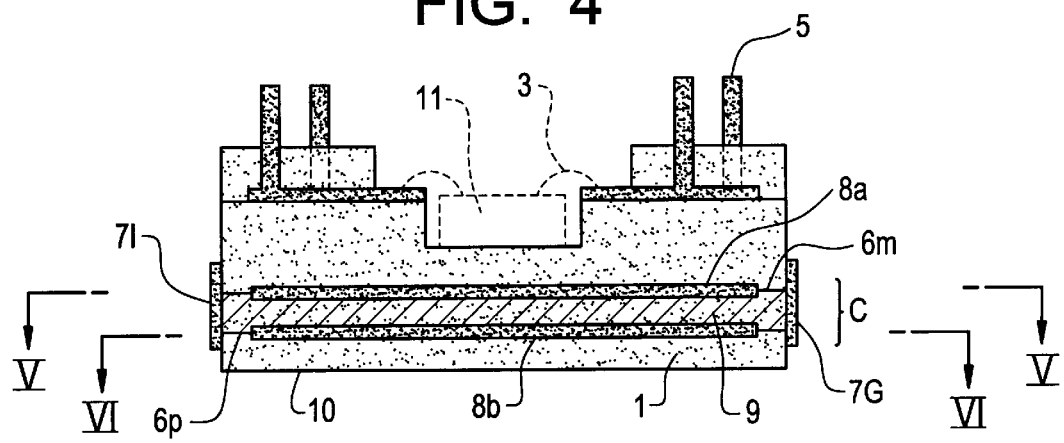
FIG. 4 is a view similar to FIG. 1 but shows a further embodiment.
Figure 5:
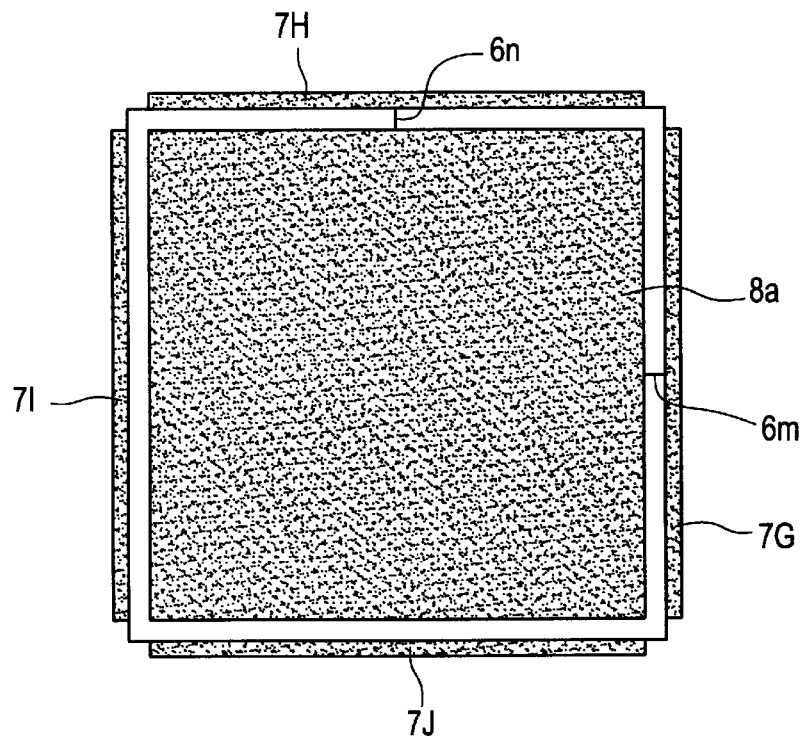
FIG. 5 is a sectional view taken along the line V—V of FIG. 4 and shows in plan a first electrode layer of the package main body of FIG. 4.
Figure 6:
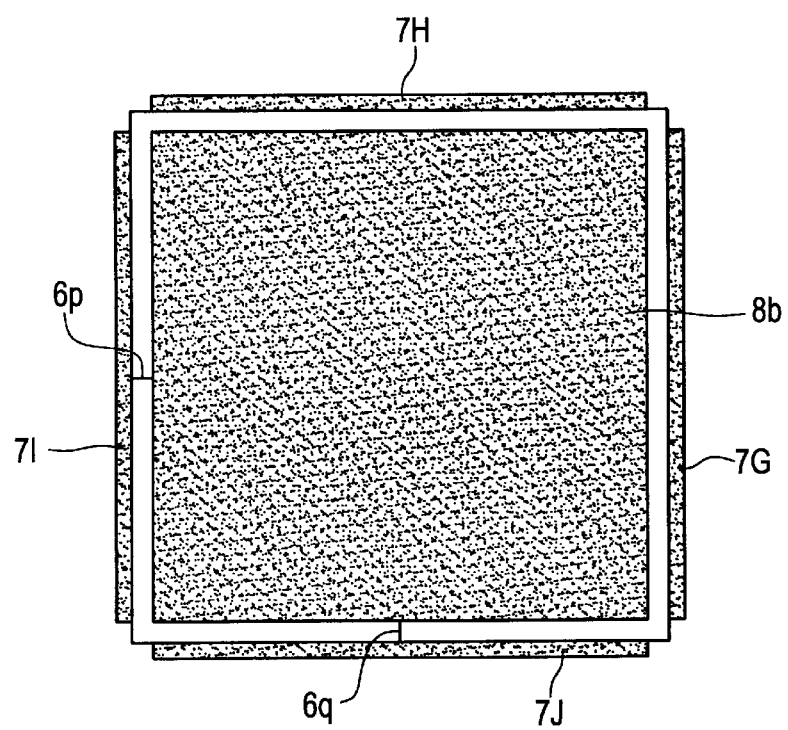
FIG. 6 is a sectional view taken along the line VI—VI of FIG. 4 and shows in plan a second electrode layer of the package main body of FIG. 4.

Referring to FIGS. 4 to 6, a further embodiment will be described.

In this embodiment, the package main body 10 has formed therewithin a condenser C constructed of a pair of electrode layers 8a and 8b and a dielectric layer 9.

The electrode layers 8a and 8b are so formed as to have an outer periphery located close to the outer periphery of the ceramic substrate 1 in order to have a large electrostatic capacity. Further, for forming the dielectric layer 9 a thin green sheet of the thickness of about 50 μm and of a material which is alumina based similarly to the ceramic substrate, is used.

In this instance, the electrode 8a is provided with connection wires 6m and 6n for connection with the conductive layers 7G and 7H, and the electrode 8b is provided with connection wires 6p and 6q for connection with the conductive layers 7I and 7J. In this connection, a set of the conductive layers 7G and 7H and a set of the conductive layers 7I and 7J are arranged so as to be insulated from each other.

With this embodiment, an inspection of such a defect that the insulation resistance between the two electrodes 8a and 8b of the condenser C is low (insulation defect) or a short circuit between the two electrodes 8a and 8b is developed (short defect) and further an inspection of whether the condenser C has a desired electrostatic capacity can be carried out by measuring the continuity, insulation resistance, electrostatic capacity, etc. between the conductive layers 7G or 7J and 7I or 7H.

Accordingly, a defective unit can be detected for removal prior to being added with value at the plating process by a simple inspection.

In the meantime, while the package main body of this embodiment has been described and shown as being provided with only one condenser C, this is not for the purpose of limitation but two and more condensers can be formed in the package main body by laminating dielectric layers and electrode layers, in order to increase the electrostatic capacity and to correspond to a plurality of power sources or power units.

Further, since a short circuit at one place of the condenser results in an overall defect, the electrode layer can be separated into a plurality of smaller electrode layer sections so that normal electrode layer sections are connected to obtain a desired condenser or a plurality of condensers are formed so as to correspond to a plurality of power sources or power units.

Figure 7:
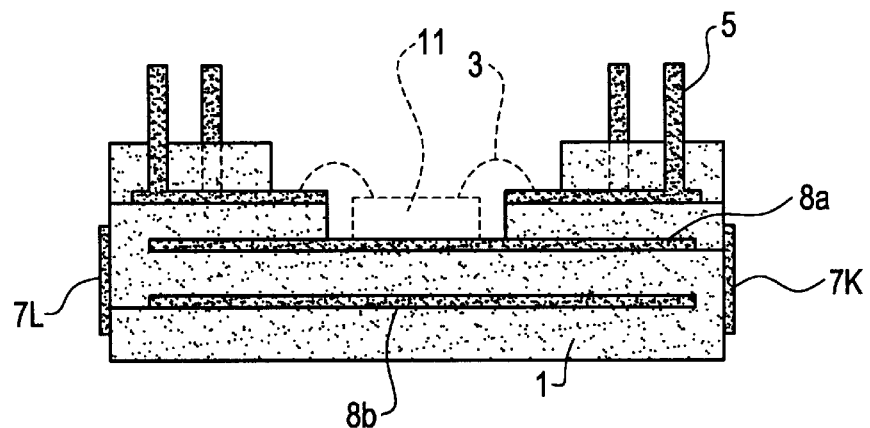
FIG. 7 is a view similar to FIG. 4 but shows a variant of the present invention.

Further, in case, as shown in FIG. 7, a portion of the electrode 8a (a central portion in the figure) is used as a die-attach portion for attachment of an integrated circuit chip 11, also the die-attach portion needs to be plated with nickel and/or gold.

In this instance, since the electrode 8a is connected to the conductive layer 7K, it can be treated similarly to a tie bar for plating of a circuit wiring according to the prior art whereby it can be conveniently plated all at once together with the pad portions, terminals, and the like.

From the foregoing, it will be understood that according to the present invention the inspection of the continuity, electrostatic capacity, resistance value, and the like is carried out prior to plating of the package main body or connection of external terminals, and the like, whereby a defective product having a short circuit defect, open defect, insulation defect, defect on electrostatic capacity value, defect on resistance value, or the like can be detected for removal.

In the foregoing, it is to be noted that while in this embodiment the circuit wiring has been described as being formed with the connection wires (plating tie bars) on the premise that the circuit wiring needs to be plated in order to be plated all at once by way of the conductive layers, only the circuit wires that require an inspection can be formed with connection wires and conductive layers in order to carry out the inspection, and the plating of the circuit wiring can be carried out separately.

It is further to be noted that while in the above described embodiments alumina is used for forming the ceramic substrate, this is not for the purpose of limitation but other insulating materials such as aluminum nitride, mullite, cordierite, glass ceramic, or the like can be used in place therefor in accordance with the object of usage.

It is further to be noted that the circuit wiring, in place of such one that is formed inside the ceramic substrate, can be formed on the outer surface of the ceramic substrate or can be formed on both inside and outside the ceramic substrate.

It is further to be noted that the circuit wiring of this invention includes via holes or through holes (plated or filled with a conductive material) for electrically connecting circuit wires printed on each ceramic green sheets before firing, and can be varied in the width or thickness or partially in the material in order to have a resistance or inductance.

It is further to be noted that the circuit wiring can be separated into a plurality of sections, for example a power source circuit, earth circuit, etc.

It is further to be noted that the material of the circuit wiring is a high melting point metal such as tungsten, molybdenum, or the like and is suitably selected in accordance with the material of the ceramic substrate and the method of forming of the same.

Accordingly, in case the ceramic material of a low firing temperature is employed or the circuit wiring is formed by baking on the ceramic substrate after the firing thereof, there may be such a case in which silver, copper, palladium, gold, platinum, or the like is used for forming the circuit wiring.

It is further to be noted that the connection wires are formed in the similar manner and from the similar material to the circuit wiring.

It is further to be noted that though the conductive layers can be co-fired together with the ceramic substrate and the circuit wiring as described with respect to the embodiments of this invention, it can otherwise be formed by screen-printing silver or copper paste onto the ceramic substrate after the firing thereof and baking the paste.

It is further to be noted that the circuit portions that are formed at the end portions of the circuit wiring and require electroplating are bonding pads for connection with wires by wire bonding or for TAB, pads for connection with an integrated circuit chip by flip-chip, a die-attach portion for attachment of an integrated circuit chip, a metallized portion for connection with a seal ring which is in turn to be joined with a cover, etc.

It is further to be noted that the elements or members that are formed at the end portions of the circuit wiring and require electroplating are external terminals such as pins, leads, solder balls for ball bonding, a seal ring for joining of a cover, heat sink and heat slug serving as a radiating member, etc.

It is further to be noted that since the present invention will do if the connection layers are formed on the outer surface of the ceramic substrate, preferably the peripheral side surfaces of the same, so it will be apparent that the shape of the ceramic substrate needs not necessarily be a nearly square as shown in the embodiments but can be circular, rectangular, etc.

It is further to be noted that the connection layers which are insulated from or electrically connected to each other need not to be located side by side, and one peripheral side surface of the ceramic substrate can be formed with two or more connection layers.

It is further to be noted that the condenser will do if it is of the kind formed inside or on the surface of the ceramic substrate, and the shapes, positions and the materials, etc. of the electrode layers and the dielectric layer can be selected in accordance with the material of the ceramic substrate, etc. That is, in case the condenser is formed inside the ceramic substrate, the dielectric layer will do if it is capable of being co-fired with the ceramic substrate, for example, there is a case the dielectric constant is made higher by mixing molybdenum, or the like to alumina or a case a high dielectric material such as $BaTiO_3$ is used. Accordingly, the thickness and material of the dielectric layer can be determined on the basis of the required electrostatic capacity, the material of the ceramic substrate, or the like. The details of the electrode layers can be determined similarly to the above described circuit wiring on consideration of the material, firing temperature, etc. of the ceramic substrate and the dielectric layer. On the other hand, in case the condenser is formed on the outer surface of the ceramic substrate, the dielectric layer can be formed by a thick-film forming technique, i.e., by applying high dielectric paste onto the outer surface of the ceramic substrate and baking the same or by a thin-film forming technique, i.e., by forming a film of $Ta_2O_5$ or the like by spattering, and the electrode layers can be formed by a thick-film or thin-film forming technique. Of the above, particularly in case the same material as the ceramic substrate is used for the dielectric, it is obliged to make the dielectric layer thinner since it is impossible to attain a high dielectric constant on the basis of the material, thus being liable to cause an insulation defect, a short circuit defect. Thus, in this case, the present invention is particularly useful.

It is further to be noted that the portion of the electrode layer to be electroplated is a die-attach portion as shown in the embodiment and further a metallized portion, etc. for joining of a heat sink, etc.

It is further to be noted that while the ceramic package main body of this invention has been described and shown as constituting part of a ceramic package for housing therewithin an integrated circuit chip, this is not for the purpose of the limitation but the ceramic package main body can be used for housing therewithin other electronic devices.

It is further to be noted that the ceramic package main body is not limited to the type that cooperates with a cap or cover to enclose therewithin an integrated circuit chip or other electronic devices but can be of the type that is not used together with a cap or cover but is solely used for mounting thereon an integrated circuit chip or other electronic devices.

What is claimed is:

1. A method of producing an insulating package main body, comprising the steps of:

preparing an insulating package main body having an insulating substrate, a circuit wiring formed inside of or on a surface of said insulating substrate, a plurality of removable conductive layers formed on said insulating substrate and electrically insulated from each other, and a plurality of connection wires connecting between said circuit wiring and said conductive layers; and examining an electrical property between said removable conductive layers and determining, from the result of said examining, an electrical property between selected particular two wires of said circuit wiring.

2. A method of producing an insulating package main body, comprising the steps of:

preparing an insulating package main body having an insulating substrate, a condenser made up of a dielectric layer, a first electrode and a second electrode which are formed inside of or on a surface of said insulating substrate, first and second removable conductive layers formed on said insulating substrate and electrically insulated from each other, a first connection wire connecting between said first electrode and said first removable conductive layer, and a second connection wire connecting between said second electrode and said second removable conductive layer; and examining an electrical property between said first removable conductive layer and said second removable conductive layer and determining, from the result of said examining, an electrical property of said condenser.

3. A method according to claim 1, further comprising, after said examining and determining, electroplating said circuit wiring by electrically connecting said first and second removable conductive layers to a power unit.

4. A method according to claim 3, further comprising, after said electroplating, removing said first and second removable conductive layers.

5. A method according to claim 3, further comprising, after said examining and determining, electroplating said first electrode by using said first removable conductive layer as a tie bar.

6. A method according to claim 5, further comprising, after said electroplating, removing said first and second removable conductive layers.

7. A method according to claim 1, wherein said insulating package is a ceramic package.

8. A method according to claim 7, wherein said ceramic package is selected from the group consisting of aluminum nitride, mullite and cordierite.

9. A method according to claim 2, wherein said insulating package is a ceramic package.

10. A method according to claim 9, wherein said ceramic package is selected from the group consisting of aluminum nitride, mullite and cordierite.

* * * * *